United States Patent
Johannesson et al.

(10) Patent No.: US 8,046,657 B2
(45) Date of Patent: Oct. 25, 2011

(54) DECODING METHOD AND APPARATUS

(75) Inventors: Hanna Johannesson, Lund (SE); Ali S. Khayrallah, Cary, NC (US); Gregory E. Bottomley, Cary, NC (US)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 1318 days.

(21) Appl. No.: 11/451,724

(22) Filed: Jun. 13, 2006

(65) Prior Publication Data

US 2007/0011600 A1    Jan. 11, 2007

Related U.S. Application Data

(60) Provisional application No. 60/691,601, filed on Jun. 17, 2005.

(51) Int. Cl.
    *H03M 13/45* (2006.01)
(52) U.S. Cl. .................................. 714/752; 714/780
(58) Field of Classification Search .................. 714/752, 714/780
    See application file for complete search history.

(56) References Cited

U.S. PATENT DOCUMENTS

| | | | |
|---|---|---|---|
| 6,604,220 B1* | 8/2003 | Lee | 714/769 |
| 6,976,203 B2* | 12/2005 | Kurtas et al. | 714/755 |
| 7,058,878 B2* | 6/2006 | Kanaoka et al. | 714/794 |
| 7,099,411 B1* | 8/2006 | Wu et al. | 375/341 |
| 7,219,295 B2* | 5/2007 | Yamada | 714/758 |
| 7,237,173 B2* | 6/2007 | Morita et al. | 714/755 |
| 7,564,933 B2* | 7/2009 | Marrow | 375/346 |
| 2002/0003846 A1 | 1/2002 | Khayrallah et al. | |

OTHER PUBLICATIONS

Gallo, A. S. et al., "A Novel Soft-In Soft-Out Detection Algorithm for Space-Time Coded OFDM over Multipath Fading Channels", 2004 GLOBECOM, Dec. 2004, vol. 1, pp. 351-355.*
Gunther, J. H. et al., "A Generalized BCJR Algorithm and Its Use in Turbo Synchronization", 2005 ICASSP, Mar. 2005, pp. III-837-840.*
Gunther, J. H. et al., "Blind Turbo Equalization Using a Generalized LDPC Decoder", 2004 IEEE 11th Digital Signal Processing Workshop & IEEE Signal Processing Education Workshop, Aug. 2004, pp. 206-210.*
Gallager, R.G., *Low-Density Parity-Check Codes*. 1963, 90 pages, MIT Press, Cambridge, Massachusetts.
Gallager, R.G., "Low-Density Parity-Check Codes", IRE Transactions on Information Theory, Jan. 1962, pp. 21-28.
Engdahl, K. and Zigangirov, K. SH., "On the Theory of Low-Density Convolutional Codes I", Problems of Information Transmission, Oct.-Dec. 1999, pp. 295-310, vol. 35.
Lentmaier, Michael., *Towards a Theory of Codes for Iterative Decoding*. Ph.D. Thesis, Mar. 7, 2003, 168 pages, Lund University, Sweden.

(Continued)

*Primary Examiner* — Stephen Baker
(74) *Attorney, Agent, or Firm* — Coats & Bennett, PLLC (57) ABSTRACT

According to a method and apparatus taught herein, a decoding circuit and method decode linear block codes based on determining joint probabilities for one or more related subsets of bits in received data blocks. The use of joint probabilities enables faster and more reliable determination of received bits, meaning that, for example, joint probability decoding requires fewer decoding iterations than a comparable decoding process based on single-bit probabilities. As a non-limiting example, the decoding circuit and method taught herein provide advantageous operation with Low Density Parity Check (LDPC) codes, and can be incorporated in a variety of communication systems and devices, such as those associated with wireless communication networks.

20 Claims, 2 Drawing Sheets

OTHER PUBLICATIONS

Feltström, Alberto Jiménez., *Soft Iterative Decoding of Low-Density Convolutional Codes*. Engineering Licenciate Thesis, Oct. 16, 1997, 71 pages, Lund University, Sweden.

Gunther et al., "Blind Turbo Equalization Using a Generalized LDPC Decoder," 2004 IEEE 11th Digital Signal Processing Workshop & IEEE Signal Processing Education Workshop, Aug. 1-4, 2004, pp. 206-210.

Gunther et al., "A Generalized LDPC Decoder for Blind Turbo Equalization," IEEE Transactions on Signal Processing, Oct. 2005, pp. 3847-3856, vol. 53, No. 10.

* cited by examiner

FIG. 3

DECODING METHOD AND APPARATUS

RELATED APPLICATIONS

This application claims priority under 35 U.S.C. §119(e) from the provisional patent application entitled "Method and Apparatus for Decoding of LDPC Codes Using Joint Probability Information," filed on 17 Jun. 2005 and assigned Ser. No. 60/691,601, and which is incorporated herein by reference.

BACKGROUND

The present invention generally relates to communications, and particularly relates to decoding data encoded via linear block codes, such as Low Density Parity Check (LDPC) codes.

In principle, a noisy channel communication channel supports data transmission at an arbitrarily low error rate up to a capacity limit of the channel. Providing robust and practical forward error correction coding, while simultaneously making efficient use of the channel capacity presents significant challenges. Various known coding techniques support relatively simple decoding operations, while offering the ability to approach theoretical channel capacity limits as defined by the signal-to-noise ratios (SNRs). In particular, Low Density Parity Check (LDPC) codes offer an excellent combination of implementation practicality and good channel capacity utilization.

More generally, LDPC codes represent one type of linear block code that enables practical decoding implementations, while allowing channel capacity utilization to approach the theoretical capacity limits. More information on LDPC codes and conventional decoding can be found in R. G. Gallager, "Low-density parity-check codes," IRE Trans. Info. Theory, vol. 8, pp. 21-28, January 1962, which incorporated herein in its entirety by reference. Other codes, such as Turbo Codes, offer similar advantages.

Linear block codes offer practical approaches to decoding because they can be decoded using relatively simple, iterative decoding operations. Conventional approaches to block decoding rely on bitwise probability information by, for example, iteratively updating the probabilities of individual bits in a received data block.

SUMMARY

In one or more embodiments as taught herein, decoding circuits and methods recover data from received data blocks that are encoded using linear block codes based on calculating joint probabilities for one or more subsets of related bits in the received data block. For example, in one embodiment, a method of decoding a received data block that is encoded via a linear block code represented by a parity check matrix comprises initializing joint probabilities of bit subsets in the received data block, updating the joint probabilities based on the parity check matrix, and recovering encoded data from the received data block using the updated joint probabilities. A parity check matrix identifies bit relationships in the received data block, and represents a set of parity check equations, which can be evaluated in terms of the joint probabilities.

In one or more embodiments, the joint probability calculation occurs once, based on the initialized values. In other embodiments, the initialized values are used to obtain recalculated joint probabilities in a first iteration. Those results are then used as initial values for one or more subsequent iterations, or used as the basis for calculating final joint probabilities. Whether to iterate and/or the number of iterations to be performed may be controlled as a function of an iteration metric. In one embodiment, the iteration metric depends on received signal quality or strength.

While not so limited, the methods and circuits taught herein apply to Low Density Parity Check (LDPC) and other linear block codes. For LDPC and other linear block codes, a received data block can be considered as having been encoded using an inner (parity) code and an outer block code, e.g., a given LDPC can be considered as representing two nested or cascaded codes. In such embodiments, a decoding circuit can be configured to calculate initial joint probabilities using a reduced number of bit relationships defined by the given LDPC code, and then use the remaining (or all) bit relationships to update those initial joint probabilities. Of course, the decoder circuit configuration in such embodiments is applicable to circumstances where a given linear block code is "viewed" as comprising nested codes, and to circumstances where separate codes are actually used.

Of course, the present invention is not limited to the above features and advantages. Indeed, those skilled in the art will recognize additional features and advantages upon reading the following detailed description, and upon viewing the accompanying drawings.

DETAILED DESCRIPTION

Figures 1, 2:
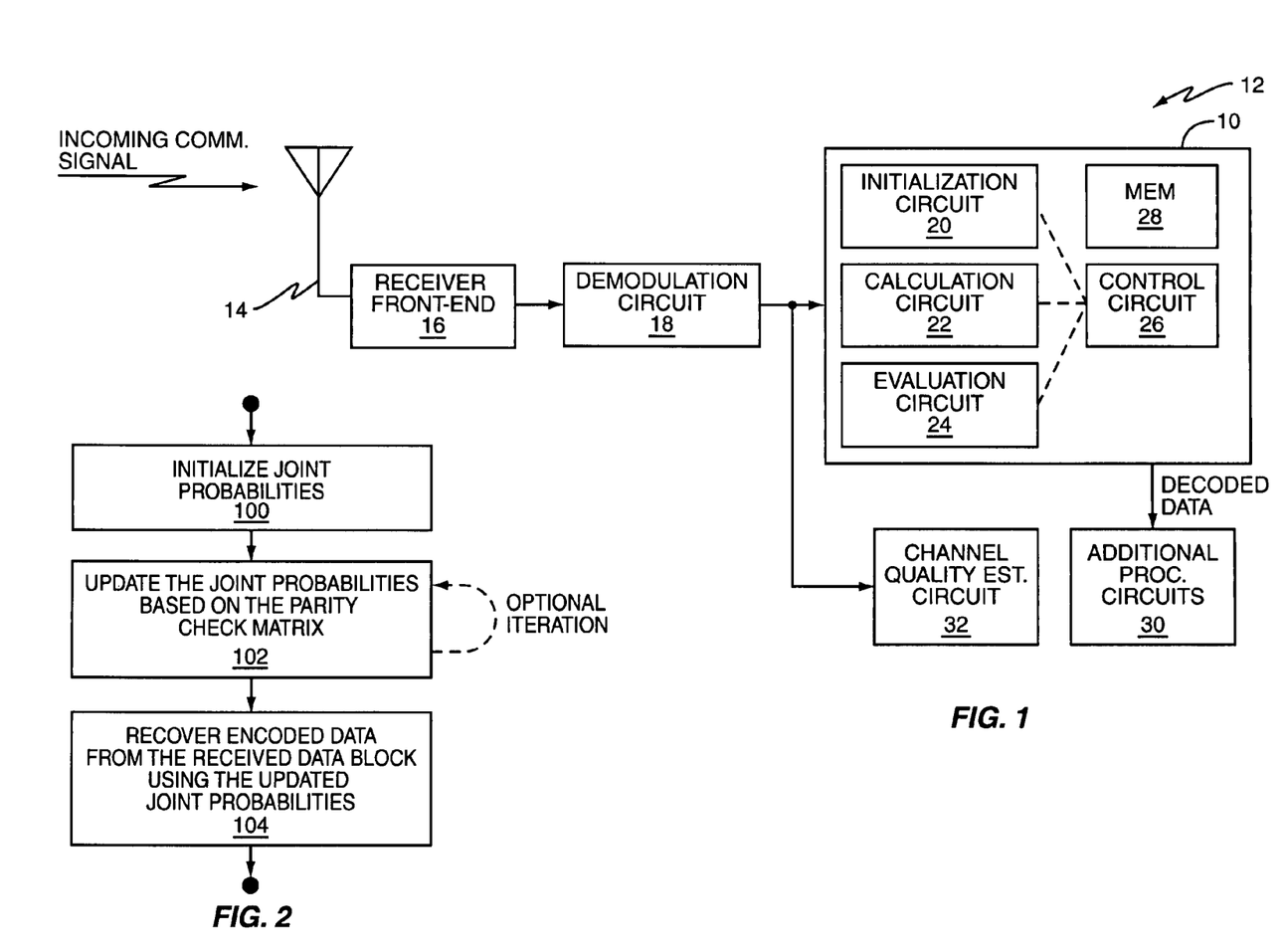
FIG. 1 is a block diagram of one embodiment of a decoding circuit included in one embodiment of a wireless communication receiver.
FIG. 2 is a logic flow diagram of one embodiment of processing logic for decoding linear block coded data using joint probabilities.

FIG. 1 illustrates one embodiment of a decoding circuit 10 that is configured to use joint probability estimation in its block decoding operations. As compared to the use of single-bit probabilities in block decoding, the use of joint probabilities provides, among other things, more reliable decoding results in fewer iterations, thereby improving performance, reducing power consumption, etc. In the illustration, the decoding circuit 10 is included within a wireless communication receiver 12, which may be understood as generally representing a fixed or mobile receiver within a wireless communication network or system. As such, the receiver 12 may comprise a radio base station, or a mobile station, such as a cellular radiotelephone, Portable Digital Assistant, pager, or other wireless communication device.

The receiver 12 includes an antenna 14 for receiving incoming signals, including communication signals carrying block-encoded data—e.g., data blocks encoded using LDPC codes. The receiver 12 further includes a front-end circuit 16 for filtering and digitizing the received signal, a demodulation circuit 18, which, in one or more embodiments is configured to provide the decoding circuit 10 with soft values corresponding to individual or joint bit estimates. One embodiment of the decoding circuit 10, which may be implemented in hardware, software, or any combination thereof, includes an initialization circuit 20, a calculation circuit 22, an evaluation circuit 24, and an optional control circuit 26, to support its processing of received data blocks. Data recovered from received data blocks by the decoding circuit 10 via its joint probability evaluation processing passes to one or more additional processing circuits 30.

FIG. 2 illustrates one embodiment of processing logic that is implemented by the one or more processing circuits comprising the decoding circuit 10 for carrying out joint probability evaluation. The illustrated processing begins with initializing joint probabilities of bit subsets in a received data block (Step 100), and continues with updating the joint probabilities based on a parity check matrix associated with the block encoded received data (Step 102). As will be detailed later herein, the update processing may comprise a one-shot operation where final joint probabilities are calculated from the initial joint probability estimates, or may comprise an iterative process. In either case, the updated joint probabilities obtained from such processing are used to recover the encoded data from the received data block (Step 104). It should be understood that these illustrated processing actions may be performed on an ongoing basis, as part of received signal processing.

In one or more embodiments, initializing joint probabilities of bit subsets in the received data block comprises using the parity check matrix to identify the bit subsets as coupled bits in the received data block and initializing probability values for possible combinations of bit values in each bit subset. In other words, the parity check matrix identifies the bits in the received data block that are related. For fixed codes, the known relationships may be predefined and used by the decoding circuit 10 as a matter of course. However, the decoding circuit 10 can be configured to evaluate any given parity check matrix to identify related bits and as a result gain the flexibility to recognize and accommodate different codes. In at least one embodiment, the linear block code associated with the received data blocks comprises an LDPC code, and the parity check matrix comprises a set of, parity check equations, with each parity check equation identifying coupled bits in the received data block.

However the related bits are identified for purposes of determining the bit subsets for which joint probabilities are estimated, the process of updating the joint probabilities comprises, in one or more embodiments, updating the joint probabilities as a function of all related combinations of the joint probabilities as indicated by the parity check matrix.

More detailed mathematical explanations for an example embodiment provide a basis for understanding the broad decoding method explained above. Thus, by way of non-limiting example, the below matrix H represents an example LDPC code parity check matrix, wherein each row represents a Parity Check Equation (PCE), and each column represents a bit position in the received data blocks:

$$H = \begin{bmatrix} 100010001000 \\ 010001000100 \\ 001000100010 \\ 000100010001 \\ 100001000010 \\ 010010000001 \\ 001000011000 \\ 000100100100 \end{bmatrix} \quad \text{Eq. (1)}$$

Equation 2 represents a generator matrix G that corresponds to the parity check matrix H.

$$G = \begin{bmatrix} 100100111010 \\ 010100000101 \\ 001100110000 \\ 000010011001 \\ 000001100110 \end{bmatrix} \quad \text{Eq. (2)}$$

From the above matrices, one sees that the example block code is 12 bits in length, and that eight PCEs represented by the matrix rows indicate the related bits. For example, PCE1 indicates that bit positions 1, 5, and 9 are related. More particularly, according to even parity, PCE1 states that the values of bits 1, 5, and 9 in any received data block must sum to zero. Correct received values of bits 1, 5, and 9 therefore include {0,0,0}, {0,1,1}, {1,1,0}, and {1,0,1}. Similarly, PCE2 indicates that bits 2, 6, and 10 sum to zero, PCE3 indicates that bits 3, 7, and 11 sum to zero, and so on.

Notably, one also sees from H that PCE1 and PCE6 both involve bit 5. The ability to relate bits between PCEs and within PCEs provides a basis for the joint probability decoding of the decoding circuit 10. With this in mind, consider an implementation of joint probability decoding that forms related subsets of bits as bit pairs. (Those skilled in the art will appreciate that other subsets may be used, such as triplets, etc.) PCE1 indicates that bits 1 and 5 are related, and a first pair of related bits may be formed as (1,5), which is denoted herein as $d_{(1,5)}$. Other related bit groupings can be similarly formed; namely: (2,10), (3,9), (4,7), (6,11), and (8,12).

There are four probabilities for each related bit pair—i.e., possible bit value combinations—corresponding to the patterns (0,0), (0,1), (1,0), and (1,1). Thus, probabilistic decoding according to the joint probability decoding operations of the decoding circuit 10 requires maintaining multiple probability values for each related bit subset. Memory 28 (shown in FIG. 1) may be included in, or associated with, the decoding circuit 10 for maintaining multiple probability values for the different bit combinations associated with each subset.

Using $d_{(1,5)}$ as an example, the four corresponding intrinsic values for bits 1 and 5 are $$P_{(1,5)}^{int}(00) = (1-P_1^{int})(1-P_5^{int}) \quad \text{Eq. (3)}$$

$$P_{(1,5)}^{int}(01) = (1-P_1^{int})P_5^{int} \quad \text{Eq. (4)}$$

$$P_{(1,5)}^{int}(10) = P_1^{int}(1-P_5^{int}) \quad \text{Eq. (5)}$$

$$P_{(1,5)}^{int}(11) = P_1^{int}P_5^{int} \quad \text{Eq. (6)}$$

where the term "intrinsic" denotes the starting or initial joint probability values. Single-bit probabilities, such as $P_1^{int}$, denote the probability that a bit takes on the value of "1," as opposed to "0." As noted in the discussion of FIG. 2, the initialization circuit 20 can be configured to set the intrinsic joint probability values based on the corresponding bit soft values output by the demodulation circuit 18. Later discussion herein contemplates demodulator embodiments that provide joint demodulation information, rather than single-bit soft values. (8PSK demodulation stands as one example of demodulation processing that produces joint demodulation information. With 8PSK, the demodulation process determines three bits per symbol, and the joint probabilities can be determined using these intrinsically related bit subsets.)

Returning to Eq. (3)-Eq. (6), one sees that, if desired, only three of the possible patterns need to be computed, as the four patterns must sum to 1 in terms of probability. Regardless, the decoding circuit 10 carries out the processing of Eq. (3)-Eq. (6) for each of the related bit pairs ($d_{(1,5)}$, $d_{(2,10)}$, $d_{(3,9)}$, $d_{(4,7)}$, $d_{(6,11)}$, and $d_{(8,12)}$). With that, the joint probabilities for the related bit subsets of interest are initialized and joint probability processing continues with the calculation of updated joint probabilities.

For the first iteration, and using $d_{(1,5)}$ as an example, three sets of joint probabilities are formed for bits 1 and 5, with these probabilities corresponding to the exclusion of different ones of the three PCEs that include one or both of bits 1 and 5. (One or both bits 1 and 5 appear in PCE 1, 5, and 6.) For the "01," pattern, the joint probability is updated at the ith iteration according to $$P_{1,(1,5)}(01) = P_{(1,5)}^{int}(01)Pr\{PCE5 \text{ met}|(1,5)=01\} \quad \text{Eq. (7)}$$
$$Pr\{PCE6 \text{ met}|(1,5)=01\}$$
$$= P_{(1,5)}^{int}(01)(P_{5,(6,11)}(00,i-1)+P_{5,(6,11)}(11,i-1)) \cdot \quad \text{Eq. (8)}$$
$$\left(\frac{1-(1-2P_{6,2}(i-1))(1-2P_{6,12}(i-1))}{2}\right)$$

where the "1,(1,5)" subscript on P denotes the exclusion of PCE1 from the joint probability calculation for bits 1 and 5. Such exclusion avoids a probability bias that would otherwise arise. The bias may be understood in the sense that extra information about bits 5 and 9 helps with determining bit 1 in the context of PCE1, but such information should not come from PCE1 itself. Instead, the additional knowledge should come from other (remaining) PCEs involving bits 5 or 9, and from the related intrinsic joint probabilities (or the updated joint probabilities from a prior iteration.)

Because both bits in the pair $d_{(6,11)}$ are included in PCE5, the probability of an even number of ones in PCE5, excluding bit 1, can be calculated by the sum $P_{5,(6,11)}(00,i-1)+P_{5,(6,11)}(11,i-1)$. Similar calculation updates are made for the 00, 10, and 11 bit patterns. One also may observe that single bit probabilities appear, such as $P_{6,2}(i-1)$. The decoding circuit 10 can be configured to obtain single-bit probabilities as needed by, for example, summing two joint probabilities. For example, the single-bit probability for the second bit of PCE6 can be calculated as $$P_{6,2} = P_{6,(2,10)}(10,i-1)+P_{6,(2,10)}(11,i-1) \quad \text{Eq. (9)}$$

Thus, the probability that bit 2 is a 1, excluding PCE6, is the sum of the probabilities that pair $d_{(2,10)}$ is 10, excluding PCE6, and the pair $d_{(2,10)}$ is 11, excluding PCE6.

Updating the joint probabilities excluding PCE5 for the 01 pattern is slightly different, because this calculation includes PCE1, which itself includes both bits 1 and 5. Therefore, the only remaining bit in PCE1 is bit 9. So, the term corresponding to PCE1 is given as $$P_{5,(1,5)}(01,i) = P_{(1,5)}^{int}(01)Pr\{PCE1 \text{ met}|(1,5)=01\} \quad \text{Eq. (10)}$$
$$Pr\{PCE6 \text{ met}|(1,5)=01\}$$
$$= P_{(1,5)}^{int}(01)P_{1,9}(i-1)\left(\frac{1-(1-2P_{6,2}(i-1))(1-2P_{6,12}(i-1))}{2}\right) \quad \text{Eq. (11)}$$

The decoding circuit 10 performs similar updates when it excludes PCE6, and it will be understood that, for this example, like updates occur for each of the six bit pairs—i.e., $d_{(1,5)}$, $d_{(2,10)}$, $d_{(3,9)}$, $d_{(4,7)}$, $d_{(6,11)}$, and $d_{(8,12)}$.

In the first iteration, the probabilities on the right side of the equations are initial values, i.e., the intrinsic values. In subsequent iterations, also referred to herein as intermediate iterations, the right-hand side probabilities represent the values determined in the previous iteration. In the last iteration, the decoding circuit 10 computes a single final set of joint probabilities for each of the related bit pairs for which joint probabilities are being evaluated. For example, $$P_{1,(1,5)}(01,I) = P_{(1,5)}^{int}(01)Pr\{PCE1 \text{ met}|(1,5)=01\} \quad \text{Eq. (12)}$$
$$Pr\{PCE5 \text{ met}|(1,5)=01\}$$
$$Pr\{PCE6 \text{ met}|(1,5)=01\} \quad \text{Eq. (13)}$$
$$= P_{(1,5)}^{int}(01)(P_{5,(6,11)}(00,I-1)+P_{5,(6,11)}(11,I-1)) \cdot$$
$$\left(\frac{1-(1-2P_{6,2}(I-1))(1-2P_{6,12}(I-1))}{2}\right)$$

Once the above joint probabilities have been obtained, they can be used in a variety of ways. For example, the decoding circuit 10 can evaluate each joint probability and select the pattern having the largest probability. In the context of the above example, joint probability processing developed a probability value for each possible bit pair pattern (00, 01, 10, 11), for each evaluated bit pair ($d_{(1,5)}$, $d_{(2,10)}$ $d_{(3,9)}$, $d_{(4,7)}$, $d_{(6,11)}$, and $d_{(8,12)}$). Picking the pattern having the largest probability value for each bit pair jointly determines that pair of bits. Thus, hard decisions for the received data block bits can be determined jointly. Alternatively, single-bit probabilities can be determined from the joint probabilities, and hard decisions can be made for each bit based on the single-bit probabilities—see Eq. (9), for example.

Notably, decoding received data blocks based on picking the "best" joint probabilities generally minimizes sequence error rates, while picking the best single-bit probabilities generally minimizes individual bit errors. Thus, the nature of the data being received, and possible the type of communication systems and applications involved, may make one approach preferable over the other.

As a further alternative, rather than using the finally-calculated joint probabilities to drive hard decisions on the received data bits, the joint probabilities can be used as a basis for setting the initial joint probability values for other bits. For example, cascaded or inner/outer block codes can be decoded by determining joint probabilities for inner code bits, and then using those joint probabilities to initialize the joint probability determination process for the outer code bits. Thus, if the received data blocks are encoded with an inner code, and then an LDPC code, for example, the decoding circuit 10 can compute joint probabilities for related bit subsets using the inner code, and then pass those joint probabilities to outer-code LDPC decoding.

If desired, the decoding circuit 10 can apply the method of feeding joint probabilities determined for an inner code as initialization values for joint probability determination of outer code bits, even when the received data blocks are not encoded using cascaded codes. For example, one may view the parity check matrix of Eq. (1) as comprising a first block code and accompanying parity check bits. With that approach, bit 9 in PCE1 is regarded as a parity check for bits 1 and 5, while bit 10 operates as a parity check for bits 2 and 6. Underlining below in Eq. (14) indicates a method of treating selected ones of the parity check bits in the H matrix as parity check bits for other bit subsets in the matrix.

$$H = \begin{bmatrix} 1000100\underline{0}1000 \\ 01000100010\underline{0} \\ 0010001000\underline{1}0 \\ 000100010\underline{0}01 \\ 10000100001\underline{0} \\ 01001000000\underline{1} \\ 001000011\underline{0}00 \\ 000100100\underline{1}00 \end{bmatrix} \quad \text{Eq. (14)}$$

Continuing the above example in more detail, the LDPC code corresponding to the parity check matrix H is split into inner and outer codes, with bit 9 serving as a parity check for bits 1 and 5, and so on. Thus, bits (1,5,9) can be created using a simple rate 2/3 code (bits 1 and 5 in, bits 1, 5, and 9 out). The same encoding relationship extends to (bits 2, 6, 10), (3, 7, 11), and (4, 8, 12). With that, the inner decoding process of this embodiment of decoding circuit 10 uses bits 9, 10, 11, and 12 to determine joint probabilities for bits (1,5), (2,6), (3,7), and (4,8). For example, the probability that (1,5) is 01 would be "A" times the product of the probabilities that bit 1 is 0, bit 5 is 1, and bit 9 is 1. The value for A is determined such that these joint probabilities sum to 1. After such processing, the inner code bits 9 through 12 are discarded, and the "remaining" outer code would be an LDPC code given as, $$\begin{pmatrix} 10100110 \\ 01011001 \\ 10101001 \\ 01010110 \end{pmatrix} \quad \text{Eq. (15)}$$

With these joint probabilities determined, the decoding circuit 10 uses them as the initialization values for iterative recalculation, or as the basis for final joint probability calculations for the (1,5), (2,6), (3,7), and (4,8) related bit pairs.

Figure 3:
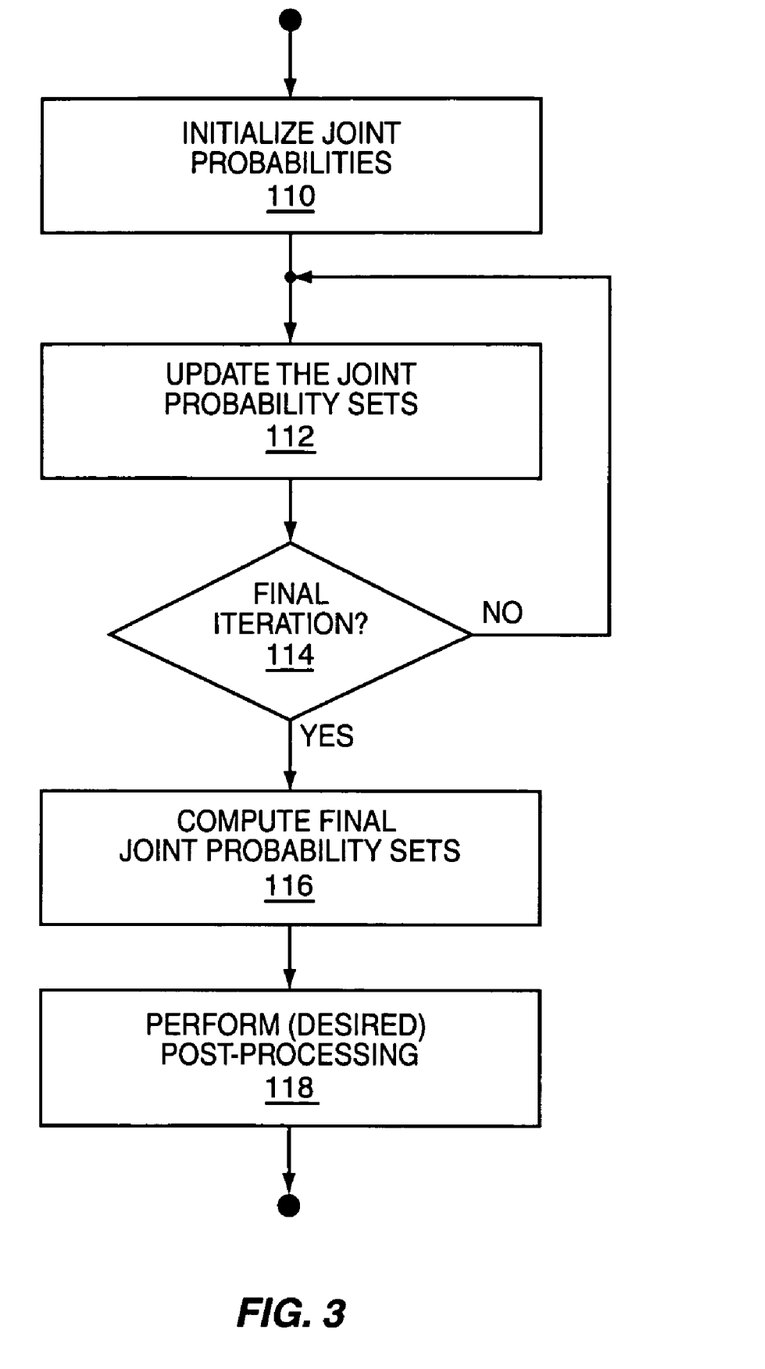
FIG. 3 is a logic flow diagram of another embodiment of processing logic for decoding linear block coded data using joint probabilities.

While the inner/outer decoding enhancement represents a particular processing embodiment of the decoding circuit 10, FIG. 3 illustrates a broad embodiment of a joint probability determination method that can be implemented in the one or more processing circuits comprising the decoding circuit 10. It should be understood that the decoding circuit 10 may comprise, for example, all or part of a baseband processing circuit, such as a digital signal processor or Application Specific Integrated Circuit (ASIC), and may be based on hardware or software, or any combination thereof. In at least one embodiment, the decoding circuit 10 comprises a computer product, such as computer program instruction code or a synthesizable logic file. In other embodiments, the decoding circuit 10 is fixed as hardware or software within an integrated circuit device.

In any case, the following processing provides a general formulation for joint probability determination in the bit-pair context—the method directly extends to other sizes of related bit subsets. While the illustrations give equations for the 01 bit pattern determination, it should be understood that the decoding circuit 10 performs such equations for the other pair patterns (00, 10, 11) as well. With that, one may define $\gamma(n_1, n_2)$ to be the set of PCEs such that either $v_{n_1}$ or $v_{n_2}$ is in the equation.

Processing begins (Step 110) with the calculation of the intrinsic joint probability values for each pair $(n_1, n_2)$ as, $$P_{(n_1,n_2)}{}^{int}(01) = (1 - P_{n_1}{}^{int}) P_{n_2}{}^{int} \quad \text{Eq. (16)}$$

The initialized joint probabilities are then updated over one or more iterations (Steps 112 and 114). For the first such iteration, the soft values of the joint probabilities are set to the initial values determined in Step 110. That is, for $j \in \gamma(n_1, n_2)$, $$P_{j(n_1,n_2)}(01,0) = P_{(n_1,n_2)}{}^{int}(01) \quad \text{Eq. (17)}$$

where the notation "$P_{j(n_1,n_2)}(01,0)$" denotes the probability determination for the 01 bit pattern for the 0th (first) iteration. For each subsequent ith iteration, i=1, . . . , I−1, the decoding circuit 10 updates the joint soft probabilities by recalculating them according to Eq. (8) and Eq. (11), for all possible combinations (patterns) of bits in the related subsets being evaluated.

Some embodiments of the decoding circuit 10 always perform updating of the joint probabilities through iterative recalculation. Even so, such embodiments can be configured to limit or otherwise determine the number of iterative recalculations according to an iteration metric. In one embodiment, the iteration metric is a defined number, such as may be held in non-volatile memory in the receiver 12. In another embodiment, the decoding circuit 10 derives the iteration metric based on the iteration-to-iteration results—e.g., the change in joint probability soft estimates across one or more iterations. Another iteration metric is determining hard decisions and checking an outer error detection code, such as a CRC, to see if there are any errors remaining. In another embodiment, the decoding circuit 10 adjusts the iteration metric as a function of a channel quality or strength estimated by the channel quality estimation circuit 32 of FIG. 1.

In such embodiments, the decoding circuit 10 may carry out more than one iteration if relatively lower channel quality (or signal strength) conditions are prevailing. However, if the estimated channel quality (or strength) exceeds a defined threshold, which may be set according to the active data or service type, the decoding circuit 10 can "convert" to single-shot joint probability determination, wherein the joint probabilities are initialized, and the final joint probability calculations are performed directly, using the initialized values.

Regardless, for the final iteration, "yes" from Step 114, the decoding circuit 10 updates the joint probabilities by performing a final calculation according to Eq. (13) (Step 116). The decoding circuit 10 and, possibly, other circuits within the receiver 12, perform desired post-processing (Step 118). For example, the decoding circuit 10 may perform hard-decision estimates of the bits in the received data block based on the joint probabilities, as explained earlier herein. The additional processing circuits 30 may further process the hard bits, which may contain control/signaling information, user/application data, voice, etc.

In one or more embodiments, the decoding circuit 10 improves its performance and/or or simplifies its operation in the above processing context by incorporating one or more approximations into its joint probability determination method. For example, instead of using a joint probability for all bits in a related subset for which the joint probability is being evaluated, the decoding circuit 10 can simplify its calculations by approximating the joint probability using the corresponding single-bit probabilities. For example, in the context of two-bit subsets as the basis for joint probability evaluation, the single-bit approximation of Eq. (8) is given as $$P_{(1,(1,5))}(01) = P^{int}_{(1,5)}(01) Pr\{PCE5 \text{ met} | (1,5) = 01\}$$ Eq. (18)

$$Pr\{PCE6 \text{ met} | (1,5) = 01\}$$

$$= P^{int}_{(1,5)}(01)\left(\frac{1 + (1 - 2P_{5,6})(1 - 2P_{5,11})}{2}\right)\left(\frac{1 - (1 - 2P_{6,2})(1 - 2P_{6,12})}{2}\right)$$ Eq. (19)

The decoding circuit 10 further can be configured to work with log-probabilities and Log Likelihood Ratios (LLRs), rather than directly with probability values. With the iteration indexes omitted for clarity, the below equations provide a basis for carrying out one or more embodiments of joint probability decoding in the decoding circuit 10, but using log-based computations—it will be understood that the equations use bits 1 and 5 and the earlier parity check matrix H from Eq. (1) as an example context:

$$\log P_{(1,5)}(01) = \log P^{int}_{(1,5)}(01) + \log P_{1,9} +$$ Eq. (20)
$$\log\left(\frac{1 + (1 - 2P_{5,6})(1 - 2P_{5,11})}{2}\right) +$$
$$\log\left(\frac{1 - (1 - 2P_{6,2})(1 - 2P_{6,12})}{2}\right)$$

$$= \log P^{int}_{(1,5)}(01) + \log P_{1,9} +$$ Eq. (21)
$$\log\left(\frac{1 + \tanh(LLR_{5,6}/2)\tanh(LLR_{5,11}/2)}{2}\right) +$$
$$\log\left(\frac{1 - \tanh(LLR_{6,2}/2)\tanh(LLR_{6,12}/2)}{2}\right)$$

If $n = n_1$ in $(n_1, n_2)$, then $$LLR_{j,n} = \log\left(\frac{e^{\log P_{(n1,n2)}(00)} + e^{\log P_{(n1,n2)}(01)}}{e^{\log P_{(n1,n2)}(10)} + e^{\log P_{(n1,n2)}(11)}}\right)$$ Eq. (22)

$$= \log\left(\frac{e^{\log P_{(n1,n2)}(00)}(1 + e^{\log P_{(n1,n2)}(01) - \log P_{(n1,n2)}(00)})}{e^{\log P_{(n1,n2)}(10)}(1 + e^{\log P_{(n1,n2)}(11) - \log P_{(n1,n2)}(10)})}\right)$$ Eq. (23)

$$= \log P_{(n1,n2)}(00) + \log\left(1 + \frac{P_{(n1,n2)}(01)}{P_{(n1,n2)}(00)}\right) -$$ Eq. (24)
$$\log P_{(n1,n2)}(10) - \log\left(1 + \frac{P_{(n1,n2)}(11)}{P_{(n1,n2)}(10)}\right)$$

and if $n = n_2$ in $(n_1, n_2)$, then $$\text{sgn}\left(\prod LLR_{n1,n2}\right)\min_{n1,n2}|\tanh(LLR_{n1,n2}/2)|$$ Eq. (29)

Further, the decoding circuit 10 can be configured to reduce the complexity of the above log-based calculations by approximating the product of the terms $\tanh(LLR_{n_1,n_2}/2)$ according to $$LLR_{j,n} = \log\left(\frac{e^{\log P_{(n1,n2)}(00)} + e^{\log P_{(n1,n2)}(10)}}{e^{\log P_{(n1,n2)}(01)} + e^{\log P_{(n1,n2)}(11)}}\right)$$ Eq. (25)

$$= \log\left(\frac{e^{\log P_{(n1,n2)}(00)}(1 + e^{\log P_{(n1,n2)}(10) - \log P_{(n1,n2)}(00)})}{e^{\log P_{(n1,n2)}(01)}(1 + e^{\log P_{(n1,n2)}(11) \log P_{(n1,n2)}(01)})}\right)$$ Eq. (26)

-continued $$= \log P_{(n1,n2)}(00) + \log\left(1 + \frac{P_{(n1,n2)}(10)}{P_{(n1,n2)}(00)}\right)$$ Eq. (27)
$$- \log P_{(n1,n2)}(01) - \log\left(1 + \frac{P_{(n1,n2)}(11)}{P_{(n1,n2)}(01)}\right)$$

which can be further reduced to $$\prod \tanh(LLR_{n1,n2}/2) \approx$$ Eq. (28)
$$\text{sgn}\left(\prod \tanh(LLR_{n1,n2}/2)\right)\min_{n1,n2}|\tanh(LLR_{n1,n2}/2)|$$

such that the decoding circuit 10 can approximate its probability evaluations based on the sign of the function given in Eq. (29).

Regardless of whether the decoding circuit 10 is configured to use the simplifying mathematical processes of Eq. (24), Eq. (27) and/or Eq. (29), it may be configured to incorporate other processing variations that offer improved or simplified performance under at least some conditions. For example, the decoding circuit 10 can be configured as a "hybrid" decoder. Under a hybrid decoding scenario, the decoding circuit 10 incorporates joint probability determinations in some of its decoding calculations, but not others. For example, a first iteration of probability determination uses joint probabilities and the decoding circuit 10 then extracts single-bit probabilities from those results. In subsequent iterations, the decoding circuit 10 uses these derived single-bit probabilities, rather than pushing the more involved joint-probability calculations through the iterative process.

Of course, the present invention is not limited by the foregoing discussion, nor is it limited by the accompanying drawings. Indeed, the present invention is limited only by the following claims, and their legal equivalents.

What is claimed is:

1. A method of decoding a received data block encoded via a linear block code represented by a parity check matrix, the method comprising:
   initializing joint probabilities of bit subsets in the received data block based on using the parity check matrix to identify the bit subsets as coupled bits in the received data block and calculating joint probability values for possible combinations of bit values in each bit subset according to corresponding soft values obtained from demodulating the received data block;
   updating the joint probabilities based on the parity check matrix, by:
      updating the joint probabilities as a function of all related combinations of the joint probabilities as indicated by the parity check matrix; and
      for one or more iterations, recalculating the joint probabilities and using the recalculated joint probabilities as initial values for a next iteration, and calculating final joint probabilities in a last iteration, wherein, in each intermediate iteration, recalculating the joint probabilities comprises, for each joint probability, excluding a corresponding one of the parity check equations from the recalculation to avoid a recalculation bias; and recovering encoded data from the received data block using the updated joint probabilities.

2. The method of claim 1, wherein the linear block code comprises a Low Density Parity Check (LDPC) code, and wherein the parity check matrix comprises a set of parity check equations, with each parity check equation identifying coupled bits in the received data block.

3. The method of claim 1, wherein calculating final joint probabilities in a last iteration comprises, for each joint probability, calculating the final joint probability by including the corresponding one of the parity check equations in a final calculation of joint probability.

4. The method of claim 1, wherein recovering encoded data from the received data block using the updated joint probabilities comprises one of determining hard bit decisions for the received data block based on selecting the greatest joint probabilities, determining hard bit decisions for the received data block based on selecting the greatest single-bit probabilities, or providing the updated joint probabilities as soft information for outer code decoding of the received data block.

5. A method of decoding a received data block encoded via a linear block code represented by a parity check matrix, the method comprising:
   initializing joint probabilities of bit subsets in the received data block based on using the parity check matrix to identify the bit subsets as coupled bits in the received data block and calculating joint probability values for possible combinations of bit values in each bit subset according to corresponding soft values obtained from demodulating the received data block;
   updating the joint probabilities based on the parity check matrix, by:
      updating the joint probabilities as a function of all related combinations of the joint probabilities as indicated by the parity check matrix; and
      evaluating received signal conditions and, based on said evaluation, selectively performing iterative or non-iterative recalculation of the joint probabilities as a function of the parity check matrix; and
   recovering encoded data from the received data block using the updated joint probabilities.

6. The method of claim 1, wherein initializing joint probabilities of bit subsets in the received data block comprises one of generating initial joint probabilities from single-bit soft values provided by a demodulation process, or generating initial joint probabilities from joint-bit soft values provided by a demodulation process.

7. The method of claim 1, further comprising expressing the joint probabilities as log-likelihoods.

8. The method of claim 7, further comprising expressing single-bit probabilities as log-likelihood ratios determined from the log-likelihoods, and wherein updating the joint probabilities based on the parity check matrix includes, for each of one or more update iterations, revising joint probability estimates by identifying greatest probabilities according to sign values of hyperbolic tangent functions used to represent the log-likelihood ratios.

9. A decoding circuit configured to decode a received data block that is encoded via a linear block code represented by a parity check matrix, the decoding circuit comprising one or more processing circuits configured to:
   initialize joint probabilities of bit subsets in the received data block by using the parity check matrix to identify the bit subsets as coupled bits in the received data block and calculating joint probability values for possible combinations of bit values in each bit subset according to corresponding soft values obtained from demodulating the received data block;
   update the joint probabilities based on the parity check matrix, by:
      updating the joint probabilities as a function of all related combinations of the joint probabilities as indicated by the parity check matrix; and
      for one or more iterations, recalculating the joint probabilities and using the recalculated joint probabilities as initial values for a next iteration, and calculating final joint probabilities in a last iteration, wherein the decoding circuit is configured to recalculate the joint probabilities in each of one or more intermediate iterations by, for each joint probability, excluding a corresponding one of the parity check equations from the recalculation to avoid a recalculation bias; and
   recover encoded data from the received data block using the updated joint probabilities.

10. The decoding circuit of claim 9, wherein the linear block code comprises a Low Density Parity Check (LDPC) code, and wherein the parity check matrix comprises a set of parity check equations, with each parity check equation identifying coupled bits in the received data block.

11. The decoding circuit of claim 9, wherein the decoding circuit is configured to calculate final joint probabilities in a last iteration by, for each joint probability, calculating the final joint probability by including the corresponding one of the parity check equations in a final calculation of joint probability.

12. The decoding circuit of claim 9, wherein the decoding circuit is configured to recover encoded data from the received data block using the updated joint probabilities by performing one of (a) determining hard bit decisions for the received data block based on selecting the greatest joint probabilities, (b) determining hard bit decisions for the received data block based on selecting the greatest single-bit probabilities, or (c) providing the updated joint probabilities as soft information for outer code decoding of the received data block.

13. The decoding circuit of claim 9, wherein the decoding circuit is configured to initialize joint probabilities of bit subsets in the received data block by performing one of (a) generating initial joint probabilities from single-bit soft values provided by a demodulation process, or (b) generating initial joint probabilities from joint-bit soft values provided by a demodulation process.

14. The decoding circuit of claim 9, wherein the decoding circuit is configured to express the joint probabilities as log-likelihoods.

15. The decoding circuit of claim 14, wherein the decoding circuit is configured to express single-bit probabilities as log-likelihood ratios determined from the log-likelihoods, and to update the joint probabilities based on the parity check matrix by, for each of one or more update iterations, revising joint probability estimates based on identifying greatest probabilities according to sign values of hyperbolic tangent functions used by the decoding circuit in representing the log-likelihood ratios.

16. The decoding circuit of claim 9, wherein the decoding circuit comprises an initialization circuit configured to initialize a set of values representing each joint probability, said set of values corresponding to hypothesized combinations of bits included in each joint probability.

17. The decoding circuit of claim 16, wherein the decoding circuit further comprises a calculation circuit configured to update the joint probabilities, and an evaluation circuit configured to provide soft or hard decisions for recovering the encoded data based on evaluating updated joint probabilities from the calculation circuit.

18. The decoding circuit of claim 17, wherein the calculation circuit includes or is associated with an iteration control circuit configured to control a number of joint probability recalculation iterations performed by the calculation circuit.

19. A decoding circuit configured to decode a received data block that is encoded via a linear block code represented by a parity check matrix, the decoding circuit comprising one or more processing circuits configured to:
  initialize joint probabilities of bit subsets in the received data block by using the parity check matrix to identify the bit subsets as coupled bits in the received data block and calculating joint probability values for possible combinations of bit values in each bit subset according to corresponding soft values obtained from demodulating the received data block;
  update the joint probabilities based on the parity check matrix, by:
    updating the joint probabilities as a function of all related combinations of the joint probabilities as indicated by the parity check matrix; and
    evaluating received signal conditions and, based on said evaluation, selectively performing iterative or non-iterative recalculation of the joint probabilities as a function of the parity check matrix; and
  recover encoded data from the received data block using the updated joint probabilities.

20. A method of decoding linear block codes comprising:
  determining first joint probabilities for a first subset of related bits in a received data block based on bit relationships identified by a first portion of a parity check matrix; and
  using the first joint probabilities as initial values for determining second joint probabilities for a second subset of related bits in the received data block.

* * * * *

UNITED STATES PATENT AND TRADEMARK OFFICE
CERTIFICATE OF CORRECTION

PATENT NO. : 8,046,657 B2
APPLICATION NO. : 11/451724
DATED : October 25, 2011
INVENTOR(S) : Johannesson et al.

It is certified that error appears in the above-identified patent and that said Letters Patent is hereby corrected as shown below:

In Column 5, Line 14, in Equation (7), delete "$P_{1,(1,5)}(01)$" and insert -- $P_{1,(1,5)}(01,i)$ --, therefor.

In Column 5, Line 63, delete "$d_{(2,10)}\ d_{(3,9)}$," and insert -- $d_{(2,10)}$, $d_{(3,9)}$, --, therefor.

In Column 6, Line 7, in Equation (12), delete "$P_{1,(1,5)}(01, I)$" and insert -- $P_{(1,5)}(01, I)$ --, therefor.

In Column 6, Line 11, in Equation (13), delete "$= P_{(1,5)}^{int}(01)(P_{5,(6,11)}(00, I-1) + P_{5,(6,11)}(11, I-1)) \cdot$" and insert -- $= P_{(1,5)}^{int}(01) P_{1,9}(I-1)(P_{5,(6,11)}(00, I-1) + P_{5,(6,11)}(11, I-1)) \cdot$ --, therefor.

In Column 6, Line 22, delete "$d_{(2,10)}\ d_{(3,9)}$," and insert -- $d_{(2,10)}$, $d_{(3,9)}$, --, therefor.

In Column 9, Line 51, delete "$\text{sgn}(\prod LLR_{n1,n2}) \min_{n1,n2} |\tanh(LLR_{n1,n2}/2)|$     Eq. (29)" and insert --

$$LLR_{j,n} = \log\left(\frac{e^{\log P_{(n1,n2)}(00)} + e^{\log P_{(n1,n2)}(10)}}{e^{\log P_{(n1,n2)}(01)} + e^{\log P_{(n1,n2)}(11)}}\right) \quad \text{Eq. (25)}$$

$$= \log\left(\frac{e^{\log P_{(n1,n2)}(00)}(1 + e^{\log P_{(n1,n2)}(10) - \log P_{(n1,n2)}(00)})}{e^{\log P_{(n1,n2)}(01)}(1 + e^{\log P_{(n1,n2)}(11) - \log P_{(n1,n2)}(01)})}\right) \quad \text{Eq. (26)}$$

$$= \log P_{(n1,n2)}(00) + \log\left(1 + \frac{P_{(n1,n2)}(10)}{P_{(n1,n2)}(00)}\right)$$
$$- \log P_{(n1,n2)}(01) - \log\left(1 + \frac{P_{(n1,n2)}(11)}{P_{(n1,n2)}(01)}\right) \quad \text{Eq. (27)}$$

--, therefor.

Signed and Sealed this
Twenty-eighth Day of February, 2012

David J. Kappos
*Director of the United States Patent and Trademark Office*

CERTIFICATE OF CORRECTION (continued)
U.S. Pat. No. 8,046,657 B2

In Columns 9 & 10, Lines 61-65 & 11-13, delete "
$$LLR_{j,n} = \log\left(\frac{e^{\log P_{(n1,n2)}(00)} + e^{\log P_{(n1,n2)}(10)}}{e^{\log P_{(n1,n2)}(01)} + e^{\log P_{(n1,n2)}(11)}}\right) \quad \text{Eq. (25)}$$

$$= \log\left(\frac{e^{\log P_{(n1,n2)}(00)}(1 + e^{\log P_{(n1,n2)}(10) - \log P_{(n1,n2)}(00)})}{e^{\log P_{(n1,n2)}(01)}(1 + e^{\log P_{(n1,n2)}(11) - \log P_{(n1,n2)}(01)})}\right) \quad \text{Eq. (26)}$$

$$= \log P_{(n1,n2)}(00) + \log\left(1 + \frac{P_{(n1,n2)}(10)}{P_{(n1,n2)}(00)}\right)$$
$$- \log P_{(n1,n2)}(01) - \log\left(1 + \frac{P_{(n1,n2)}(11)}{P_{(n1,n2)}(01)}\right) \quad \text{Eq. (27)}$$
" and insert -- $\prod \tanh(LLR_{n1,n2}/2) \approx \text{sgn}\left(\prod \tanh(LLR_{n1,n2}/2)\right) \min_{n1,n2} |\tanh(LLR_{n1,n2}/2)| \quad \text{Eq. (28)}$ --, therefor.

In Column 10, Lines 19-21, delete " $\prod \tanh(LLR_{n1,n2}/2) \approx \text{sgn}\left(\prod \tanh(LLR_{n1,n2}/2)\right) \min_{n1,n2} |\tanh(LLR_{n1,n2}/2)| \quad \text{Eq. (28)}$ "

and insert -- $\text{sgn}(\prod LLR_{n1,n2}) \min_{n1,n2} |\tanh(LLR_{n1,n2}/2)| \quad \text{Eq. (29)}$ --, therefor.